US010643735B1

(12) United States Patent
Brozek et al.

(10) Patent No.: US 10,643,735 B1
(45) Date of Patent: May 5, 2020

(54) PASSIVE ARRAY TEST STRUCTURE FOR CROSS-POINT MEMORY CHARACTERIZATION

(71) Applicant: PDF Solutions, Inc., San Jose, CA (US)

(72) Inventors: Tomasz Brozek, Morgan Hill, CA (US); Christopher Hess, Belmont, CA (US); Rakesh Vallishayee, San Jose, CA (US); Meindert Lunenborg, St Gely du Fesc (FR); Hendrik Schneider, San Jose, CA (US); Yuan Yu, San Jose, CA (US); Amit Joag, San Jose, CA (US); SiewHoon Ng, San Jose, CA (US)

(73) Assignee: PDF Solutions, Inc., Santa Clara, CA (US)

(*) Notice: Subject to any disclaimer, the term of this patent is extended or adjusted under 35 U.S.C. 154(b) by 0 days.

(21) Appl. No.: 16/033,156

(22) Filed: Jul. 11, 2018

Related U.S. Application Data

(60) Provisional application No. 62/578,117, filed on Oct. 27, 2017.

(51) Int. Cl.
*G11C 29/44* (2006.01)
*G11C 29/52* (2006.01)
(Continued)

(52) U.S. Cl.
CPC .............. *G11C 29/44* (2013.01); *G11C 16/14* (2013.01); *G11C 29/52* (2013.01); *G11C 29/56* (2013.01); *G11C 2029/0401* (2013.01)

(58) Field of Classification Search
CPC ....................................................... G11C 29/56
(Continued)

(56) References Cited

U.S. PATENT DOCUMENTS 5,619,462 A * 4/1997 McClure ................ G11C 29/02
257/48
5,706,234 A * 1/1998 Pilch, Jr. ................ G11C 29/34
365/189.07

(Continued)

OTHER PUBLICATIONS

Chen, A., "Comprehensive Methodology for the design and assessment of crossbar memory array with nonlinear and asymmetric selection devices," IEEE International Electron Devices Meeting, Washington, D.C., 2013, p. 1318.

(Continued)

*Primary Examiner* — Fritz Alphonse
(74) *Attorney, Agent, or Firm* — Pillsbury Winthrop Shaw Pittman LLP

(57) ABSTRACT

An apparatus and method for testing two-terminal memory elements organized as a cross-point memory array. The apparatus allows functional testing of two-terminal memory elements organized as a cross-point memory array, and built in a short flow manufacturing process. The proposed apparatus substantially eliminates the use of any type of additional active or passive switches, selectors, or decoders. A large number of memory elements of various memory types including planar (two dimensional) or three dimensional memory structures can be tested without the need of manufacturing selectors or running the full flow process.

13 Claims, 14 Drawing Sheets

(51) Int. Cl.
G11C 16/14 (2006.01)
G11C 29/56 (2006.01)
*G11C 29/04* (2006.01)

(58) Field of Classification Search
USPC .......................................... 714/718, 711, 720
See application file for complete search history.

(56) References Cited

U.S. PATENT DOCUMENTS

| | | | | |
|---|---|---|---|---|
| 6,046,947 | A * | 4/2000 | Chai | G11C 29/48 |
| | | | | 365/201 |
| 6,475,871 | B1 | 11/2002 | Stine et al. | |
| 2003/0236648 | A1* | 12/2003 | Yasui | G11C 29/56 |
| | | | | 702/185 |
| 2005/0152194 | A1* | 7/2005 | Boldt | G11C 29/26 |
| | | | | 365/201 |
| 2006/0236163 | A1* | 10/2006 | Hartmann | G11C 29/18 |
| | | | | 714/718 |
| 2006/0250864 | A1* | 11/2006 | Hartmann | G11C 29/18 |
| | | | | 365/201 |

OTHER PUBLICATIONS

3D Cross-Point Memory new product news release, Intel and Micron, Jun. 28, 2015, 4 pages.

* cited by examiner

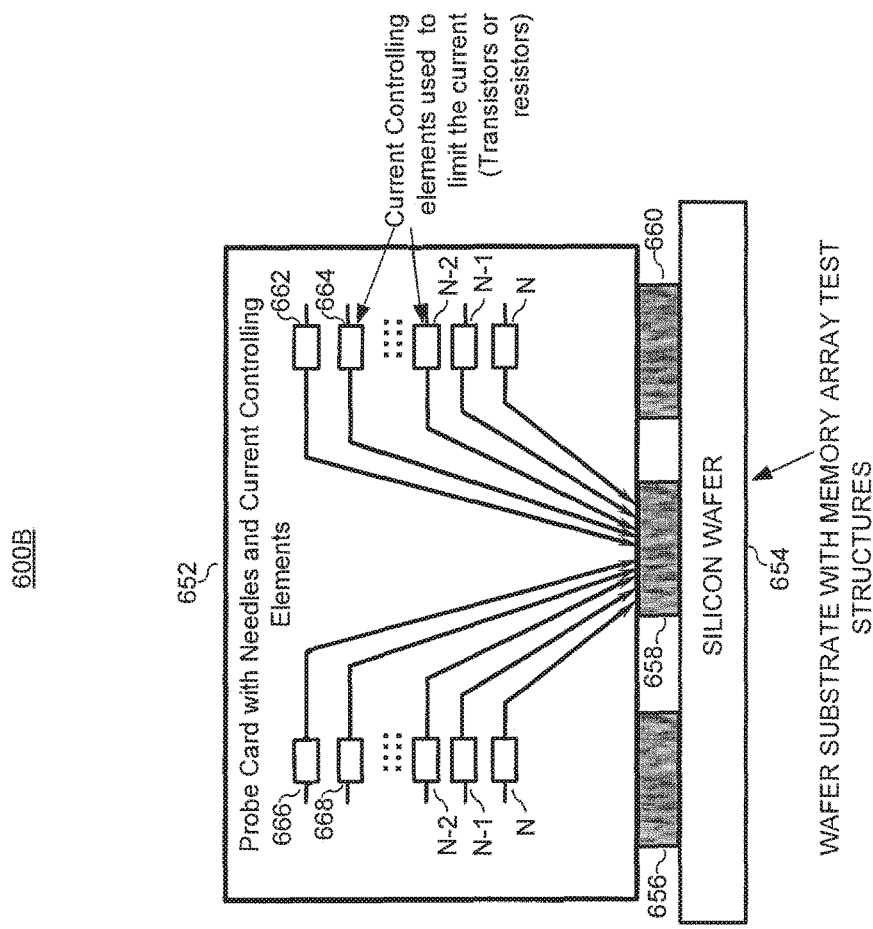
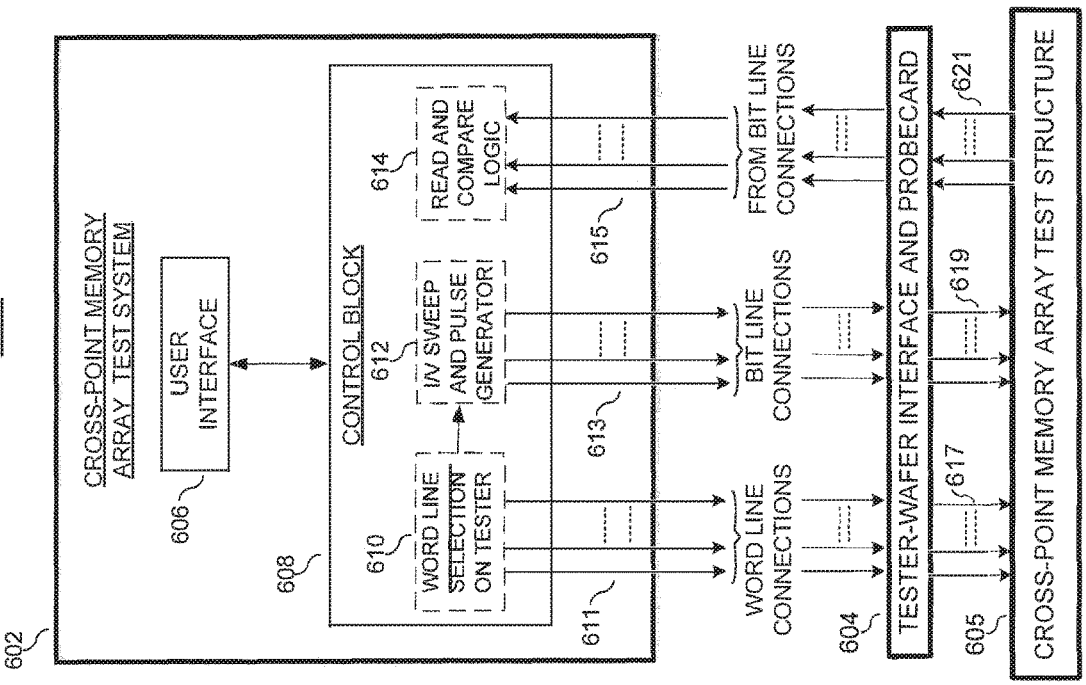
FIG. 6A
FIG. 6B

700A

| Program/Erase 704 | Pulse Requirement 702 | Waveform example 706 |
|---|---|---|
| Phase Change Memory<br><br>ReRAM (Unipolar) | Unipolar pulses: Voltage 0.1 – 4V<br>Current: 50-500uA range<br>50ns – 2us with controlled fall time<br><br>Voltage: 0.1 – 4V<br>Current: 20uA – 1mA |  |
| MRAM<br><br>ReRAM (Bipolar) | Bipolar pulses: Voltage -4 to +4V<br>Typical Current range: 20 – 200uA<br>200ps – 50ns pulses<br><br>Voltage: -4 to +4V<br>Current Range: 20uA – 1mA range<br>5ns – 50ns pulses | 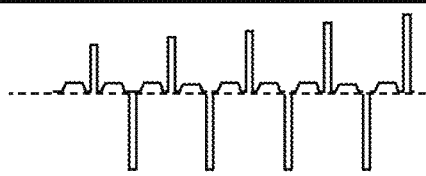 |
| Endurance testing | Fast pulse cycling with pulses as above, with periodical read-out of SET/RESET resistance | 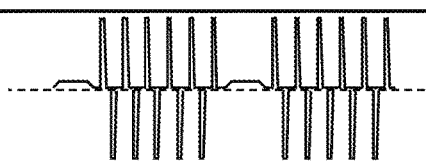 |

FIG. 7A

PASSIVE ARRAY TEST STRUCTURE FOR CROSS-POINT MEMORY CHARACTERIZATION

This application claims priority to U.S. Provisional Application No. 62/578,117 filed Oct. 27, 2017, which is expressly incorporated herein by reference.

BACKGROUND

The disclosure relates to apparatus and methods of testing a memory element, more specifically to the apparatus and methods of electrical characterization of a memory element organized in a cross-point configuration.

A large class of non-volatile memories contain two-terminal elements whose resistance can be changed by electrical stimulus, usually a voltage or/and current pulse (examples of such memories are Magneto resistive Random Access Memory (MRAM), Phase Change Memory (PCM), Resistive Random Access Memory (ReRAM), and other. Usually the memory elements are embedded between interconnect layers of integrated circuits, in so-called Back-End of the Line (BEOL). These memories are organized in an array, as rows (also referred to as word lines) and columns (also referred to as bit lines) and require additional circuit elements for their operation. Exemplary additional circuit elements include selectors, to turn off the memory elements which are not being read or written to at a given time. Typically, the selectors include transistors or diodes or a combination of both. In a typical semiconductor memory manufacturing process, the additional circuit elements are built on a silicon substrate which is followed by the building of the memory elements on the same substrate.

During memory technology development, process optimization, technology transfer from one manufacturing facility to another, the manufacturer needs to build test structures and memory arrays for functional tests, to determine their parametric properties, yield entitlement, and to sort the defective elements.

SUMMARY

Described here is an apparatus and method for testing two-terminal memory elements organized as a cross-point memory array.

More specifically, the embodiments described here teach a system of test structures and a tester which allow functional testing of two-terminal memory elements organized as a cross-point memory array, and built in a short flow manufacturing process, without using any type of additional active or passive switches, selectors, or decoders.

The disclosed embodiments enable testing arrays of a large number of memory elements without the need of manufacturing selectors or running the full flow process.

The embodiments described herein are described for a single layer of cells to best illustrate the described short manufacturing flow. However, the apparatus and the method taught herein may be used for any memory type including a planar (two dimensional) or three dimensional memory structures.

BRIEF DESCRIPTION OF THE DRAWINGS

The above aspects and other aspects and features will become apparent to those ordinarily skilled in the art upon review of the following description of specific embodiments in conjunction with the accompanying figures, wherein:

FIG. 6A illustrates an example test system coupled to a test structure for the cross-point memory array of FIG. 5, in accordance with the teachings of the present disclosure.

FIG. 6B illustrates an example of a probecard coupled to a wafer substrate with memory array test structures, to connect the tester, in accordance with the teachings of the present disclosure.

FIG. 7A illustrates a table showing exemplary waveforms of the memory structure in accordance with the teachings of the present disclosure.

DETAILED DESCRIPTION OF THE EMBODIMENTS

Figure 1:
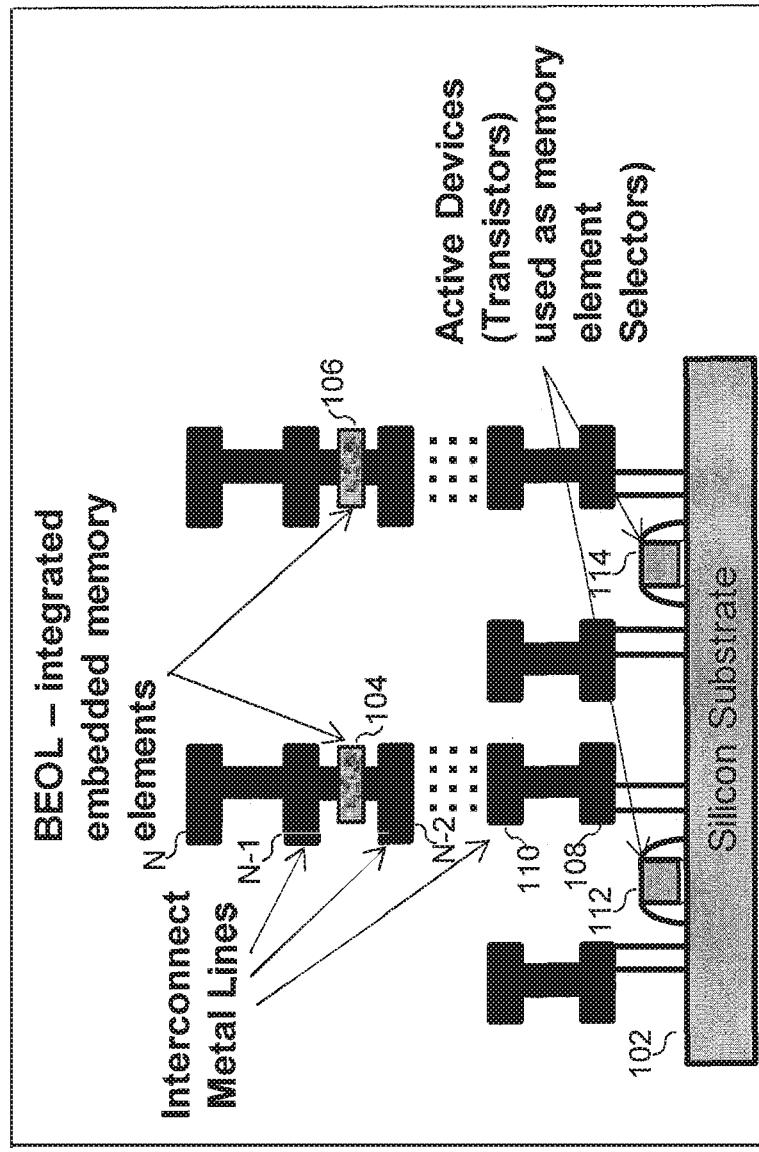
FIG. 1 illustrates an example memory element on an example semiconductor (silicon) substrate with active devices (transistors) as selectors.

Embodiments of the present disclosure will now be described in detail with reference to the drawings, which are provided as illustrative examples so as to enable those skilled in the art to practice the embodiments.

Notably, the figures and examples below are not meant to limit the scope to a single embodiment, but other embodiments are possible by way of interchange of some or all of the described or illustrated elements. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments.

In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any in the specification or claims to be ascribed an uncommon or special meaning unless explicitly set forth as such. Further, the scope encompasses present and future known equivalents to components referred to herein by way of illustration.

As explained earlier, typically memory arrays include additional circuit elements such as selectors for their operation. Therefore, conventional test structures for memory arrays also typically include the additional circuit elements to enable the specific memory elements of the array under test. Moreover, prior art solutions Passive Arrays for measurements of Resistive Elements in Cross-Point configuration mainly focus on identifying electric failures and defects through resistance measurements but not to characterize memory cells and actively change the state of memory elements. One such a solution was similar described earlier in US Patent Publication No. 6475871 B1.

Cross-Point memory implementation has been also recently announced by Intel for new product introduction—3D Cross-Point memory (originally disclosed by Intel and Micron Jul. 28, 2015). Additionally, the Crossbar (synonymous to Cross-Point) Array of memory elements was studied and modeled from resistance behavior, but conclusion was that good operation requires non-linear "selector" elements to be used in series with memory element to reduce background "sneak path" current—An Chen (Global Foundries), in IEEE Trans. Electron Devices, Vol. 60, NO. 4, p. 1318, 2013.

The proposed solution addresses the characterization needs of emerging memories, typically two-terminal elements which can be either in High-resistance or Low-resistance state. Checking functionality of such elements and characteristics of switching between the two states is of great interest for development and monitoring, and it is the subject of the disclosure.

The proposed disclosure reduces the sneak path currents by controlling the potential of each terminal and WL and BL rail with separate Source/Measure Unit of the tester. Furthermore, the parasitic resistance of the interconnections between the memory elements on the same BL or WL is reduced by a special low-resistance, balanced routing design.

Described herein is a cross-point array test system to be coupled to a cross-point array test structure for testing a cross-point memory element. The proposed cross-point array test structure, may comprise of two layers of interconnect (one used to make WLs, and another BLs) with memory elements at every crossing point of a WL and a BL. So an array of N-WLs and M BLs would have N by M crossing points and N by M memory elements. The size of the array test structure is limited by number of tester channels which can independently control all WLs and BLs, so with the number of channels equal # C, the number of WLs and BLs combined N+M should not exceed # C. For Example, a tester with 256 channels can test an array of 128×128 (128 WLs and 128 BLs), or any other combination, like 64×192, or 32×224.

The memory array test structures need to have the WLs and BLs connected to the test pads, one test pad per connection, so N by M array with N-WLs and M-BLs would use N+M test pads. A properly designed test structure needs to balance all the routing wire resistances to equalize the parasitic effects between all BLs and WLs. The connections to the Array are done at the upper interconnect layer (if the memory is embedded between conductive layers metals Mx and Mx+1, then it would be Mx+1 level), or above.

The parallel multichannel test system with independent control of voltages on every channel is used to control each of the BLs and WLs in the Array, directly connected to the Tester via a Probe card. The tester test programs execute test algorithms and collect the data from each memory element, like initial resistance, voltage required to Erase and Program the element (i.e., to change its resistance from the high resistance state to low-resistance state and vice versa). The larger the number of elements in the array, the faster the test per cell (since the testing can be done in parallel on large number of elements simultaneously), and the larger statistical sample of the cells which can be used to determine quality of the process, optimize the process through experiments, and predict the yield.

Additionally, the disclosed parallel multichannel test system may be coupled to multiple WLs or BLs or both at a time. This allows for an aggregation of data which includes the results of test algorithms from multiple memory elements. Furthermore, the test results of a single memory element may then be extracted from the aggregated data, to uniquely characterize the single memory element.

In general in the embodiments of this disclosure, routing of the connections to the memory array is implemented in a way so as to minimize the connection resistances to the WLs and BLs. Furthermore, the values of connection resistances to WLs may be balanced in such a way that they are equal and independent of their distances from the test pads. Similarly, the values of connection resistances to BLs may be balanced in such a way that they are equal and independent of their distances from the test pads. In some examples, the connection resistances to WLs may be designed to be equal to those of BLs. This is especially advantageous in case of large memory arrays, as those may require longer connections to the test pads. However, the connection resistances are balanced in such a way that those do not substantially affect the results of the tests.

The disclosed test structure is in the form of an array and may be referred to as a test structure array may closely match the memory array structure under test. In general in a typical testing scenario of a memory array, the resistance associated with a memory element under test may change from high to low or low to high in a very short amount of time. This may lead to damage of the memory element itself due to current overstress.

In one aspect of this disclosure, the testing probes of the proposed test structure may include current controlling elements such as transistors or any other active or passive electrical devices, to avoid any damage to the memory elements.

In another aspect, the disclosure teaches creating layouts patterns that can be converted into the test vehicle using the set of masks used to manufacture the wafers with test structures for test.

In a different aspect, the disclosure teaches manufacturing the test structures using full manufacturing flow or short flow (while the full flow is traditionally used to build fully functional product and the memory, the test structure of current teaching would be built in a subset of the flow, so short flow is sufficient to build them to characterize memory elements)

In another aspect, the disclosure teaches testing the test structures by connecting the tester and setting the conditions, then grounding some of the pins, and then applying pulses and electrical signals—DC, AC, or voltage sweeps, and measuring the response.

The present disclosure, when implemented, thus provides a method and tool for acceleration of development, and for yield improvement, by fixing the issues of functional, catastrophic failures, or parametric nature, preferably using a short flow approach, instead of the traditional way, thus saving time and resources.

Advantageously the disclosed test structure and test system may be used during a short-flow of the manufacturing process to accelerate to the process development.

FIG. 1 illustrates an example 100 of a memory element on an example semiconductor (silicon) substrate coupled to active devices. FIG. 1 includes a semiconductor substrate (si), a memory element, WLs and BLs and a plurality of active devices. In other examples, the substrate may be other than silicon. To illustrate, FIG. 1 includes example BEOL integrated embedded memory elements 104 and 106 on a silicon substrate 102, interconnect metal lines 108, 110 up to N, and active devices (transistors) 112 and 114. The memory elements 104 and 106 are coupled between interconnect metal lines N-2 and N-1. In a typical configuration, there are memory elements coupled between any two interconnect metal lines. The active devices are used as memory element selectors. Typically, transistors are used as active devices but any other active electrical devices may be used as memory element selectors.

Figure 2:
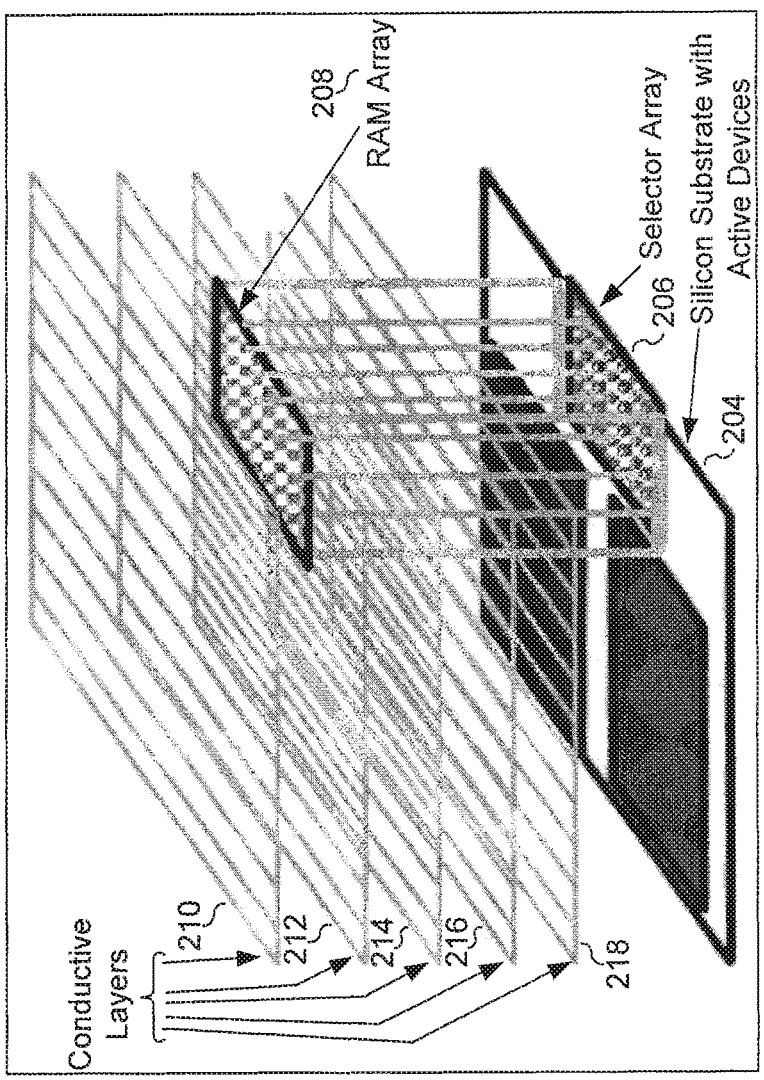
FIG. 2 illustrates an example memory array test structure connected or coupled to a selector array on a semiconductor substrate according to prior art.

FIG. 2 illustrates an example 200 of an IC product or a test chip with an embedded memory block 200, for a random access memory (RAM array) 208 coupled to a selector array 206 on an example semiconductor (silicon) substrate with active devices 204 according to prior art. The block 200 also illustrates multiple conductive layers 210, 212, 214, 216, and 218. The conductive layers may be typically made of metals such as aluminum (Al), copper (Cu), or tungsten (W) or polysilicon or any other conductive material. In a semiconductor IC, various circuit elements may be spread across a number of conductive layers. The number of conductive layers may range from two to fifteen.

Figure 3:
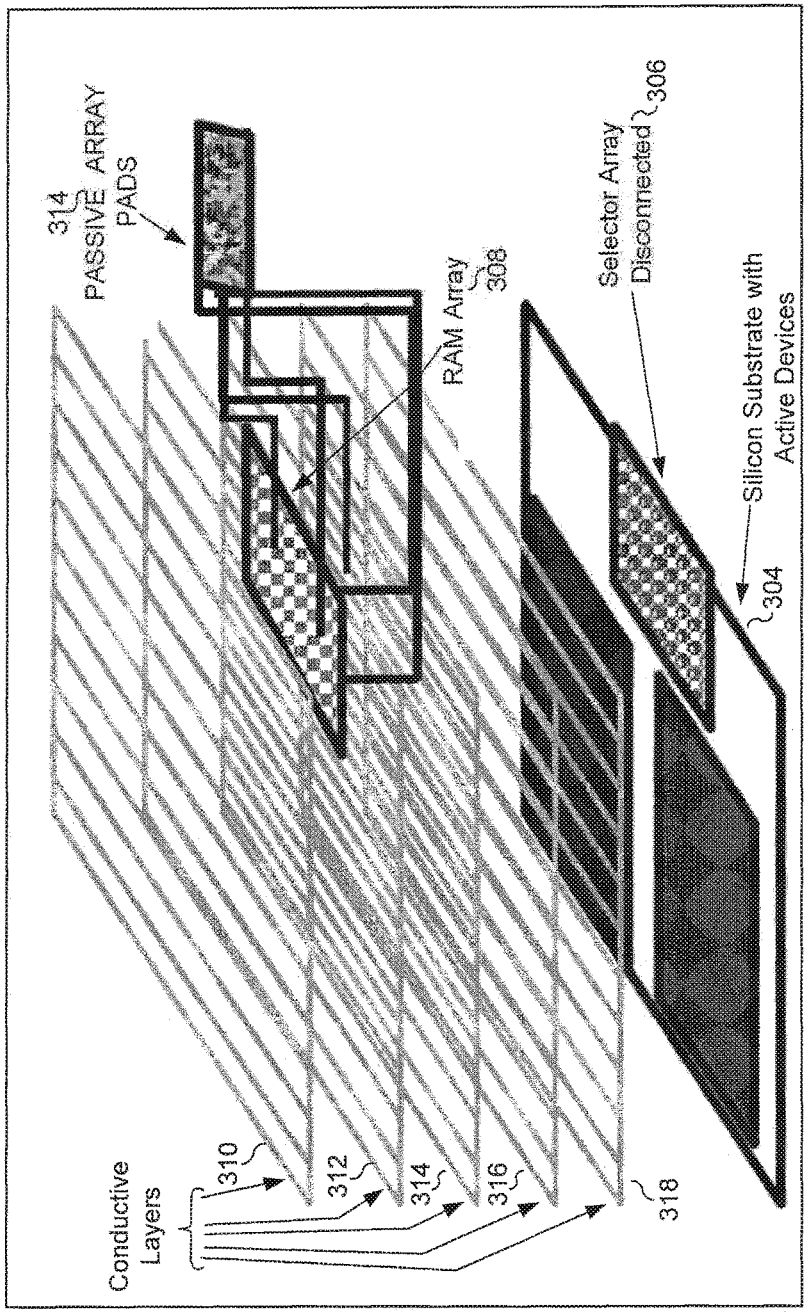
FIG. 3 illustrates an example of a memory test structure including passive array pads disconnected or decoupled from the selector array in accordance with teachings of the present disclosure.

FIG. 3 illustrates an example 300 of an IC product or a test chip with an embedded memory block 300, for a random access memory (RAM array) 308. Also shown are multiple conductive layers 310, 312, 314, 316, and 318. The block 300 is similar to the block 200 in some respects. However, as may be seen, the Ram array 308 is decoupled from the selector array 306, in accordance with the teachings of the present disclosure. FIG. 3 also illustrates passive array pads, also referred to as a passive test structure 314. As shown the passive test structure 314 may not need to be coupled to the selector array 306. In one example, the software algorithm as explained later in this specification, may replace the selector array.

According to one embodiment of this disclosure, the cross-point memory test structure may be coupled to the memory elements at any conductive layer, by removing the layers above that particular layer.

Figure 4:
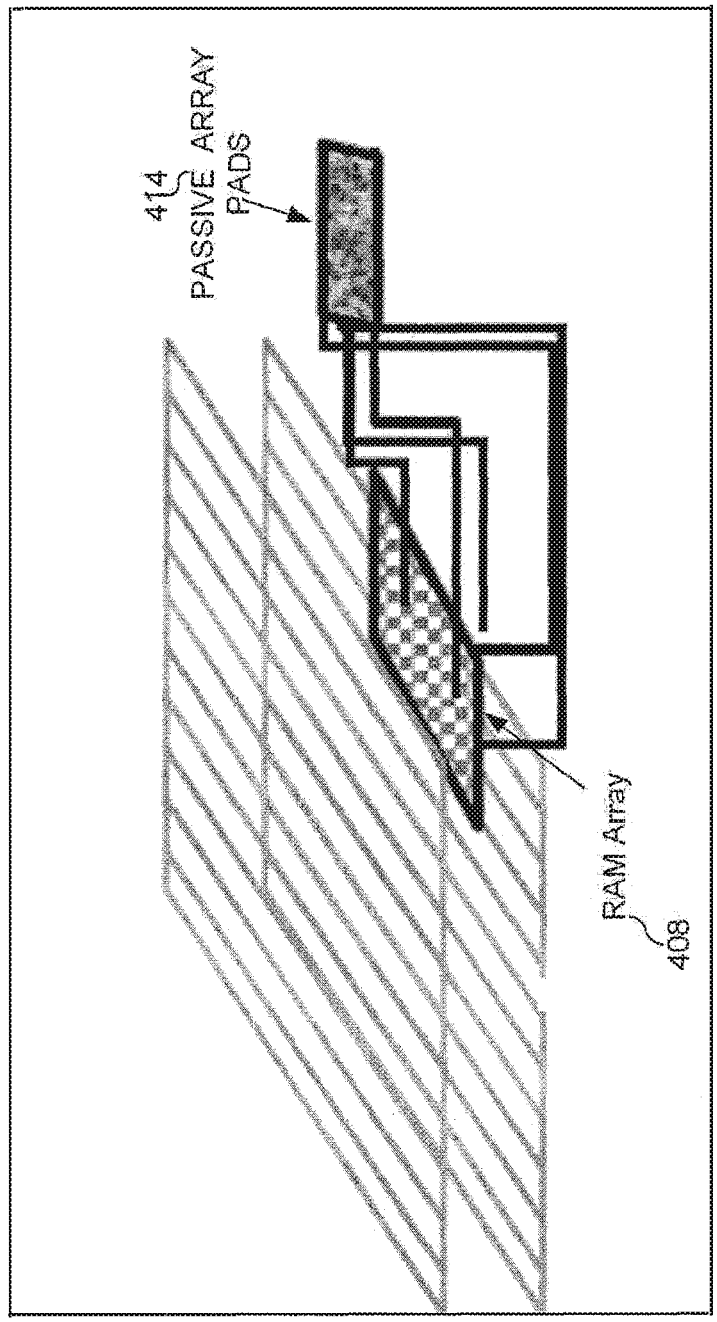
FIG. 4 illustrates an example of a memory test structure including passive array pads for a short flow testing process, in accordance with the teachings of the present disclosure.

FIG. 4 illustrates an example 400 of an IC product or a test chip with an embedded memory block 400, for a random access memory (RAM array) 408, based upon a a Back-End of the Line integration, with two interconnect layers. Thus, FIG. 4 illustrates only a short flow version of the manufacturing process which substantially represents the target manufacturing process, in accordance with the teachings of the present disclosure. A short flow with three interconnect layers integration is also within the scope of the present disclosure.

Figure 5A:
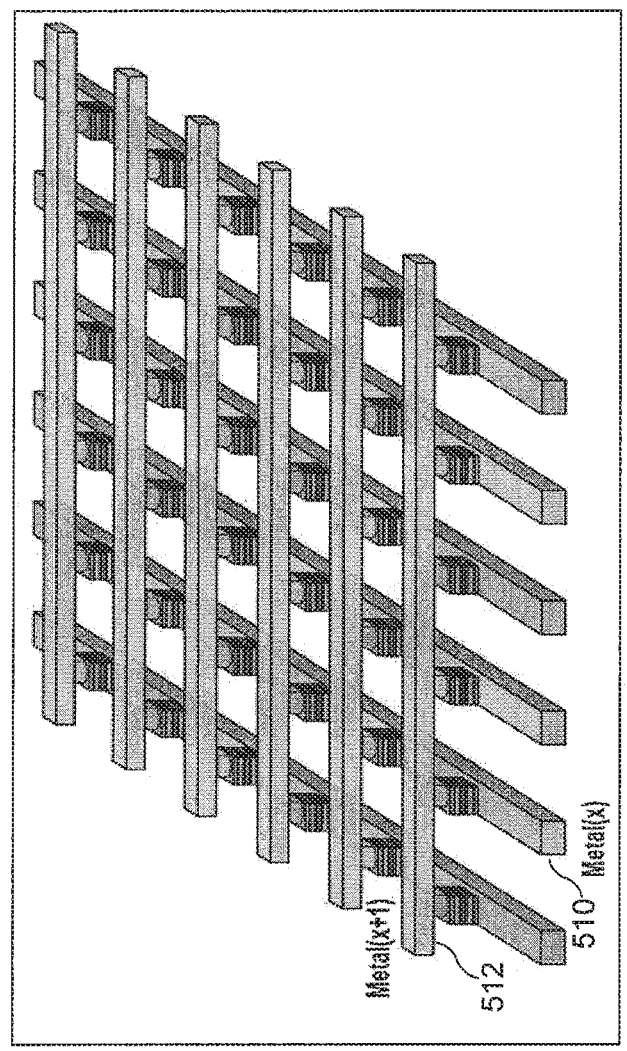
FIG. 5A illustrates an example of a passive cross-point memory array between two conductive layers.

FIG. 5A illustrates an example 500 of a cross-point memory array between two conductive layers. It includes a first conductive layer Metal$_{(X)}$ 510 comprising of word-lines and a second conductive layer Metal$_{(X+1)}$ 512 comprising of bit-lines. The bit-lines and the word-lines may be coupled to the testing probe pads, which may also be referred to as word line connections or bit line connections. A test system as such may be easily built for any cross-point memory array including any number of rows and columns, for e.g., 16×16, 32×32, 32×64, 128×128.

Figure 5B:
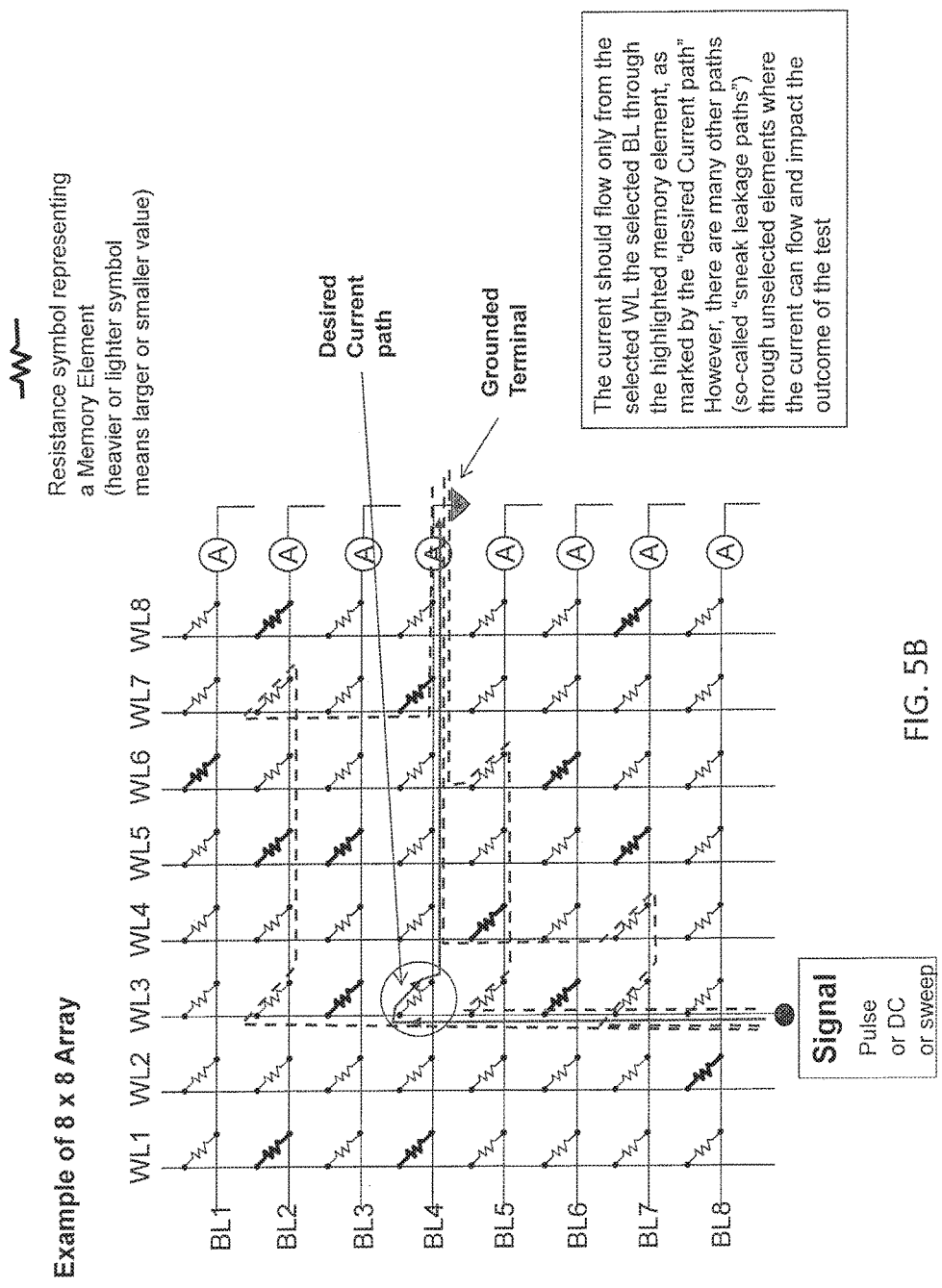
FIG. 5B illustrates an example of sneaky paths.

It is understood that the cross-point memory array illustrated in FIG. 5A has the sneaky paths referenced above, and this is shown in further detail in FIG. 5B.

A sneak leaky path can be avoided, including using either of two different implementations, described herein.

First, by modifying the layout by disconnecting the cells along "unused" WLs and BL's. As an example, assuming an original array of 1000 BL's and 1000 WL's, a subset of that array on which testing will occur is determined. Depending on the size of the testing array to build (e.g., 16×16, 32×32, 64×64) BL's and WL's are chosen for test—i.e. for a 16×16 selected test array, only 256 memory elements will be tested from the array of 10000. Based upon the 256 selected memory elements, one of the contacts may be disconnected (i.e. remove upper or lower via to memory element) for the elements that will not be tested, so only 256 will remain connected. Furthermore, the interconnect patterns may be modified, to make them wider and very low resistance, so the potential difference between two neighbor connected elements on the same WL or BL is only few tens of milliVolts, for example.

Second, with only selected WL's and BL's connected, the electrical signal is applied, either a DC or Pulse, to a single WL at a time, and ground all others. The Bitlines are also preferably grounded and the current on them measured when the DC or Pulse signal is applied on selected WL. And by sequentially applying signal from the first WL to the last, all 256 of the subset of memory elements are tested.

Low resistance between neighbor memory elements and control of all the potentials on the outer and inner nodes prevents the sneak leakage currents to become significant and impact the outcome of the test.

Figure 5C:
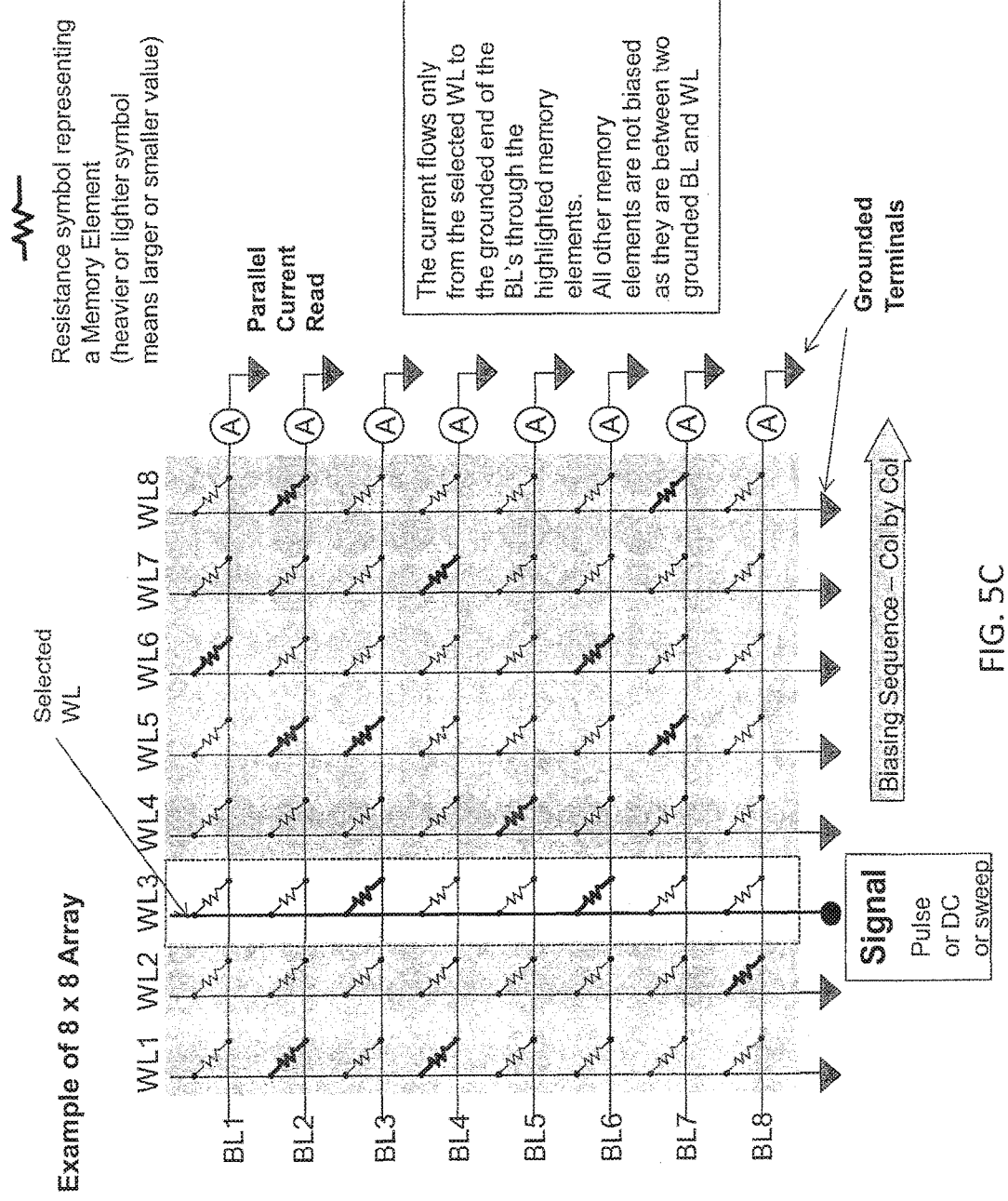
FIG. 5C shows the BL and WL bias conditions to minimize the effect of sneak leakage paths.

FIG. 5C illustrates how to ground all but one WL, and all BL's. It can be assumed that the Rows R are BL's and Columns C are WL's (obviously, the situation is symmetrical so one can invert it as well).

FIG. 6A illustrates an example test environment 600A, including a cross-point memory array test system 602 coupled to a tester-wafer interface and probecard 604, and a cross-point memory array test structure 605 in accordance with the teachings of the present disclosure. As shown the test system 602 of FIG. 6A includes a user interface 606, a control block 608, and word line connections 611, bit line connections 613. The control block 608 further includes a word line selection ON tester 610, a current/voltage (I/V) sweep and pulse generator block 612, and a read and compare logic block 614. The word line selection on tester block 610 is coupled to the tester-wafer interface and probecard 604 via the word line connections 611. The I/V sweep and pulse generator block 612 is coupled to the bit line connections 613, which are further coupled to the cross-point memory array test structure 605 via the BLs connections 619. In the present embodiment, the control block 608 is coupled to output test data to the tester-wafer interface and probecard 604 and further to the cross-point memory array test structure 605. The read and compare logic block 614 included in the control block 608, is coupled to receive data from the cross-point memory array test structure 605 via the bit line connections 615 and 621. In the disclosed embodiment, the bit line connections 613 may be the same as 615 and bit line connections 619 may be the same as 621.

In one example of the disclosed embodiment, the cross-point memory array test system 602 may send test data such as test algorithms to the cross-point memory array test structure 605 via the tester-wafer interface and probecard. The results of the test algorithms may then be read by the read and compare logic block 614 from the test structure 605, via the probecard 604. A comparison of the test results may then be used to uniquely characterize any single memory element.

FIG. 6B illustrates an example probecard 600B coupled to a wafer substrate with memory array test structures, in accordance with the teachings of the present disclosure. The probecard may be used to connect the test system to the test structures on a silicon wafer. FIG. 6B includes a silicon wafer 654 as a substrate with memory array test structures 656, 658, and 660. Coupled to that is a probecard 652 with needles and current controlling elements.

Figure 7:
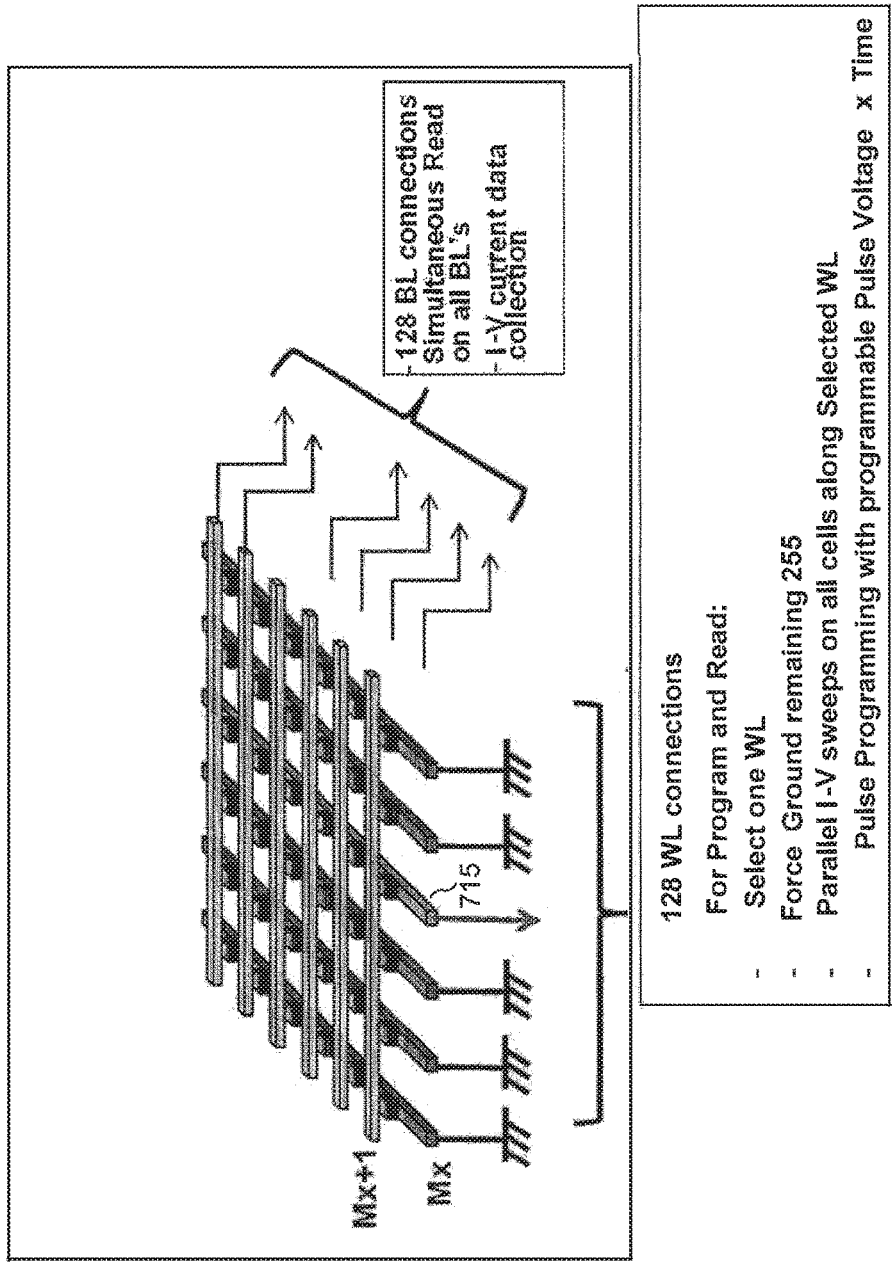
FIG. 7 illustrates an example method of testing a cross-point memory array of FIG. 5, in accordance with the teachings of the present disclosure.

FIG. 7 illustrates an example method 700 of testing a cross-point memory array of FIG. 5, using the example test structure of FIG. 6A, in accordance with the teachings of the present disclosure. FIG. 7 illustrates an example implementation of a memory array test structure, for a 16 KB passive memory array. FIG. 7 is shown to include a first conductive layer $M_X$ comprising of word-lines and a second conductive layer $M_{X+1}$ comprising of bit-lines. In one example, the bit-lines and the word-lines may be coupled to the testing probe pads, which are the word line connections and bit line connections as shown in FIG. 6A. In order to perform a memory test, only a single word line 715 may be selected while the other WLs are coupled to a GND connection or an electrical return path.

A parallel voltage sweep or pulse may be performed across one or multiple WLs to perform SET or RESET operations on the selected word line 715. In one example, the voltage sweeps may be programming pulses. After the programming is complete, the resistance values for all the bits may be measured. In one example, the initial resistance value $R_{INIT}$, the SET resistance value $R_{SET}$, and the RESET resistance value $R_{RESET}$ may all be measured and recorded. A comparison of $R_{INIT}$, $R_{SET}$, and $R_{RESET}$, may be used to characterize the memory bits. For example, it may be checked if the $R_{INIT}$, $R_{SET}$ and $R_{RESET}$ values are within a particular range of values. Or it may checked if those are above or below certain predetermined threshold values. If the resistance values are within a predetermined valid range or above or below a predetermined valid threshold, then the memory element under test may be regarded as "good" or "bad". The predetermined range of resistance values and the predetermined threshold values may be programmed by software, depending on electrical characteristics of the memory array/elements under test. In some examples, the bits may be programmed to logic high or logic low state, on the selected word line. The resistance of the programmed bits may be read and compared with the expected values to find out bad or marginal bits.

The process may be repeated for the remaining WLs. By connecting the unselected word-lines to GND, any unwanted leakage path for currents may be avoided. The current-voltage sweeps may be used for detail characterization of the memory elements, not available in compiled functional memory arrays, where the state of bits are determined with Sense Amplifiers. As such the proposed test structure may provide a more accurate characterization of a particular memory element. Furthermore, a programming voltage or current pulse may be applied to the selected BLs to measure an impact of resistances and capacitances. As such, this type of test system, can easily detect any short connections or open connections in a memory array. It can shorten the testing time due to parallelization of pulse programming and I-V sweeps.

Referring now to FIG. 7A, FIG. 7A illustrates various pulse requirements 702 for different types of memories having different Program/Erase characteristics 704. As shown in FIG. 7A, it should be understood that different types of memories are using different pulses (e.g., unipolar, bipolar, fast pulse cycling) for programming and erasing (or Set and Reset). In some embodiments, waveforms examples 706 may correspond to pulse requirements 702 of memories. Waveform examples 706 should not be considered as limiting. As waveform examples 708 show, some memories use unipolar pulses for both Set and Reset, while other need bipolar pulses (e.g. Positive for Set and reverse, Negative for Reset . . . ). Some need longer pulses—like microsecond, while other can switch much faster, at nanosecond time.

Figure 8B:
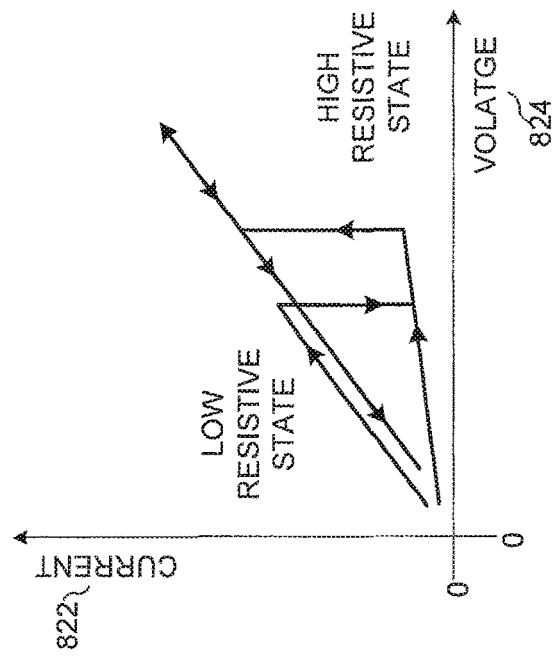
FIG. 8B illustrates waveforms 800B which illustrates an exemplary current response to voltage sweeps performed on the memory array of FIG. 5 over time.
Figure 8A:
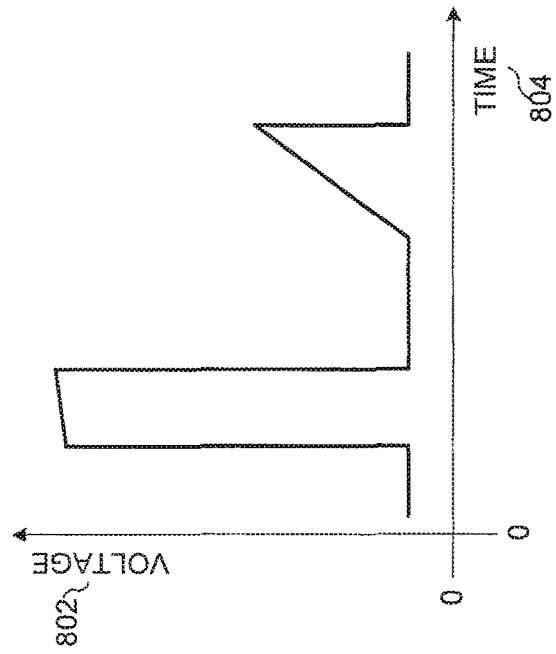
FIG. 8A illustrates exemplary waveforms 800A of voltage pulses and sweeps performed on the memory array of FIG. 5 over time.

FIG. 8A illustrates exemplary waveforms 800A of voltage sweeps on the memory elements along the selected WLs. 800A shows voltage 802 on the y-axis versus time 804 on the x-axis.

FIG. 8B illustrates exemplary waveforms 800B of current-voltage sweeps on the memory elements along the selected WLs. 800B shows current values 822 on the y-axis versus voltage values 824 on the x-axis. As shown in FIGS. 8A and 8B, corresponding I-V waveforms may be collected for multiple memory elements to determine any significant diversion from the expected behavior of an outlier element. In this way, the I-V waveforms may be used to characterize a particular memory element and further perform its failure mode analysis.

Figure 9:
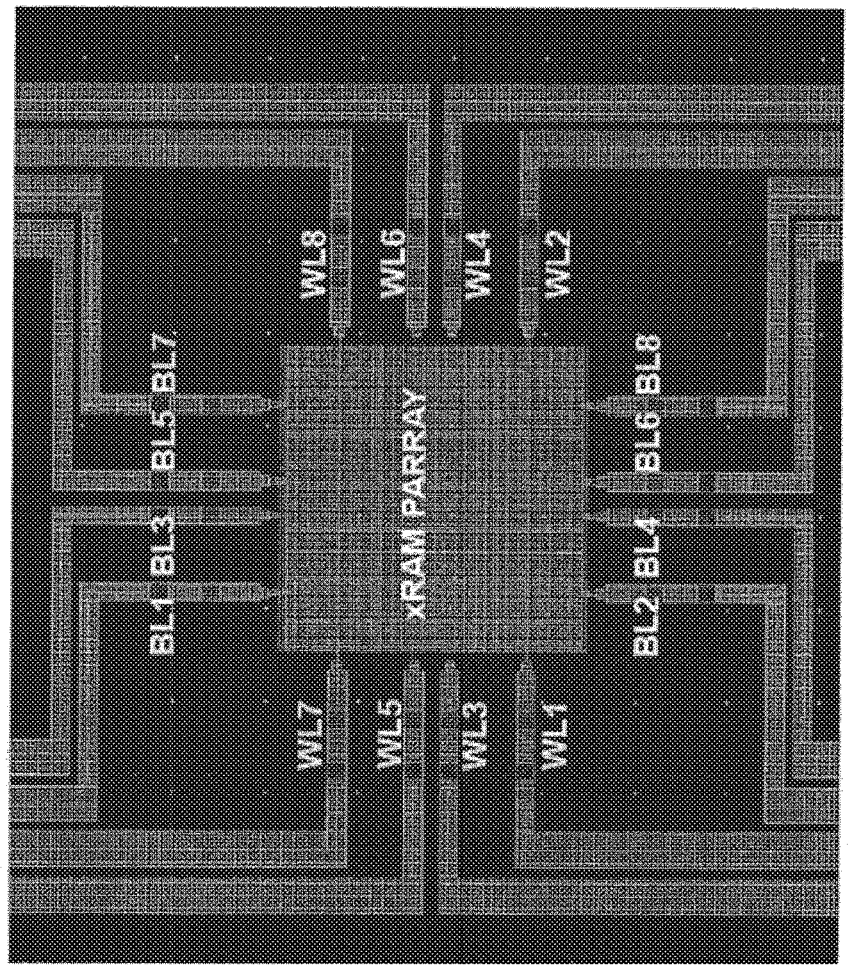
FIG. 9 illustrates an example schematic of connections of word lines (WLs) and bit lines (BLs) to an actual array of memory elements.

FIG. 9 illustrates an example layout 900 of a single memory array. The BL and WL connections can be made using lower interconnect layer, upper interconnect layer, or both.

Figure 10:
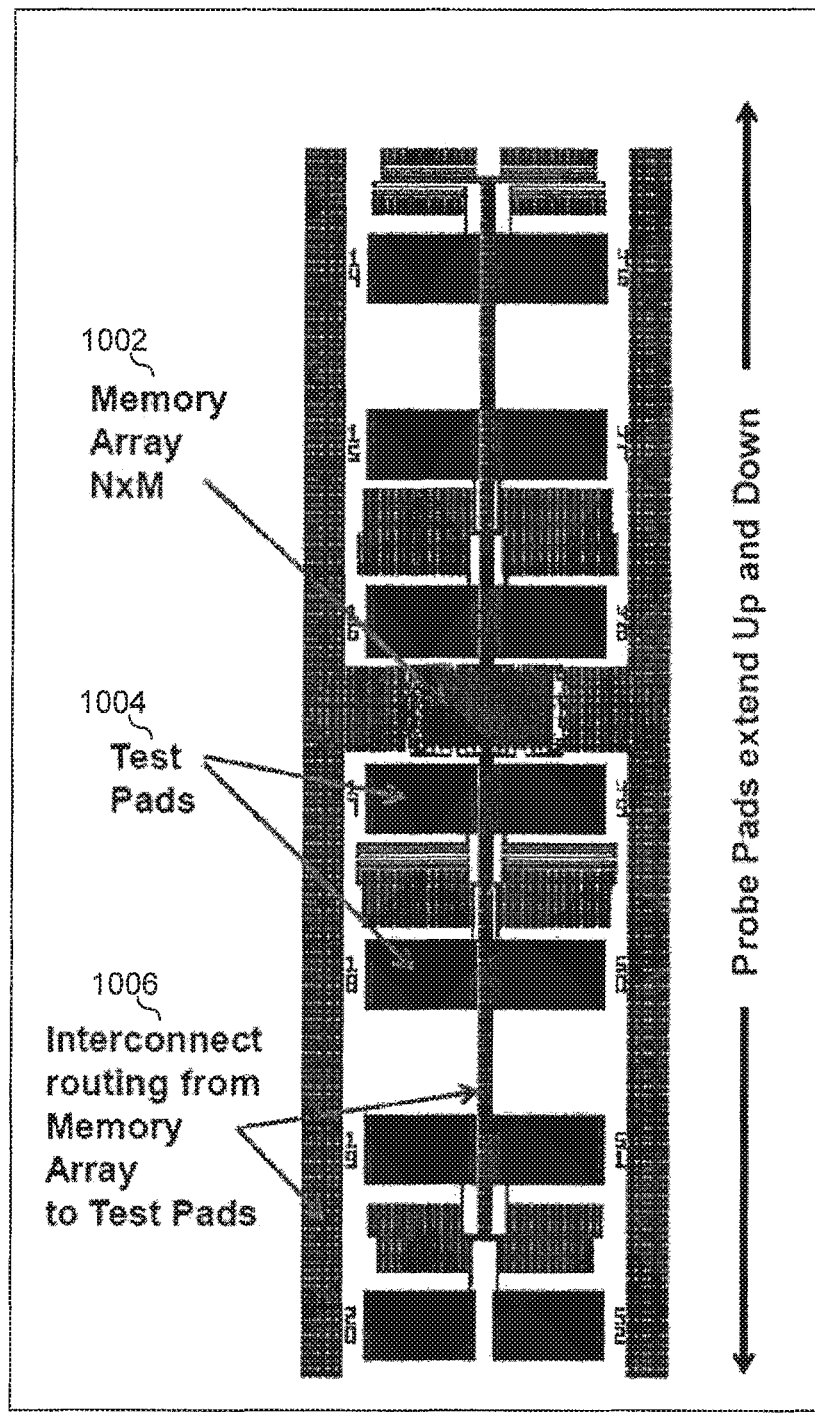
FIG. 10 illustrates an example layout of conductive layers to connect all WLs and BLs terminals to test pads coupling the test structure to the test system of FIG. 6A, in accordance with the teachings of the present disclosure.

FIG. 10 illustrates an example layout 1000 of multiple memory arrays coupled to the test probe pads in accordance with the teachings of the present disclosure. To illustrate it includes a memory array 1002 of the size N by M, test pads 1004, and interconnect routing from memory array to test pads 1006. As illustrated, the probe pads may extend up and down in any direction. The routing of the WL and the BL connections needs to have low resistance within the array (between the elements) and between the array and the pads, to reduce voltage drop along the connections. If needed, $M_{X+2}$ metal shunting can be added for low-resistance wiring (e.g. Al as RDL). Also, the resistance of interconnections from the array to the pads needs to be balanced to remain the same for pads with different location.

Figure 11:
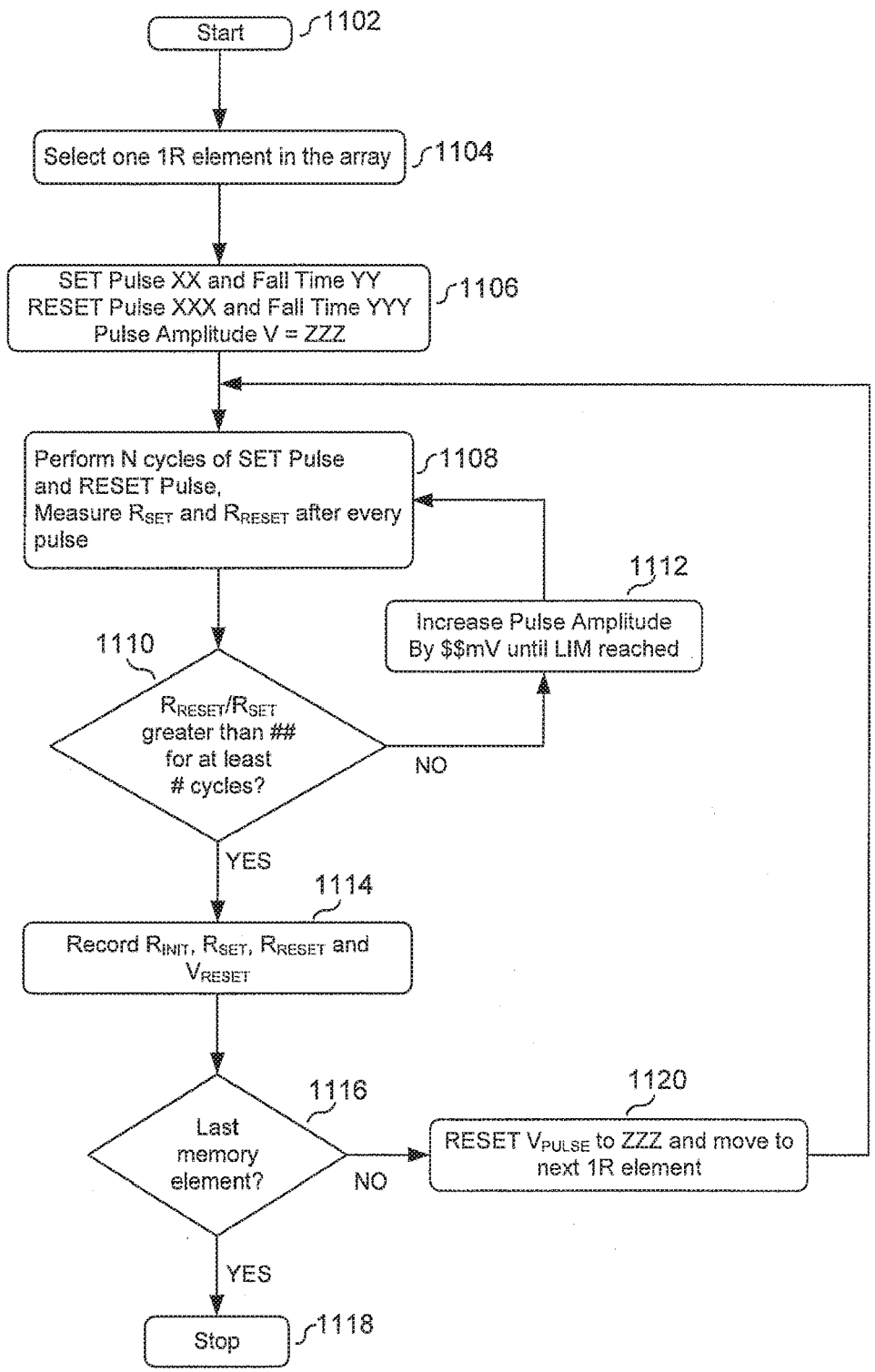
FIG. 11 illustrates an example flow diagram for a test algorithm to be used with a test system of FIG. 6A, in accordance with the teachings of the present disclosure.

FIG. 11 illustrates an example flow diagram 1100 for a test algorithm to be used with a test system of FIG. 6A. The test algorithm may be modified for multiple parallel and independent channels, so that each channel can be applied a different voltage or current. The embodiments shown here may support up to 256 channels. For a system with larger number of channels, the test algorithm will depend on the memory type under investigation. The test may be performed on single memory elements at a time, also referred to as "Bit-walking", or on larger parts of the array simultaneously, e.g. whole BL (so-called "BitLine walking"), or on segments.

As shown, after starting at block 1102, a particular memory element in the memory array may be selected at block 1104.

At block 1106, programming SET and RESET pulses may be applied to the BLs via the bit line connections.

At block 1108, a number of SET and RESET pulses may be applied and resistance values $R_{SET}$ and $R_{RESET}$ may be measured after every pulse.

At block 1110, it may be checked if the resistance values $R_{SET}$ and $R_{RESET}$ are matching predetermined values within a predetermined number of test cycles. If so, then the process moves to block 1114. If not, then the process moves to block 1112.

At block 1112, the pulse amplitude may be increase by a predetermined value. At the end of block 1112, the process moves back to the block 1108.

At block 1114, the $R_{INIT}$ ($R_{INITIAL}$), $R_{SET}$, $R_{RESET}$, and $V_{RESET}$ may be recorded. Then the process moves to block 1116.

At block 1116, it may be checked if the last memory element has been tested. If yes, then the process moves to the block 1118, where the process is stopped. If not, then the process moves to block 1120.

At block 1120, a voltage RESET pulse may be applied to make the selected word line to a high impedance state before selecting the next word line. The process then returns to the beginning of block 1108.

At the end of block 1118, the process may move back to the start block 1102, from where the process may be repeated for another memory array.

It should be readily apparent to those of ordinary skill in the art that various changes, modifications and substitutes are intended to the embodiments described herein, within the form and details thereof, without departing from intended spirit and scope. Accordingly, it will be appreciated that in numerous instances some features will be employed without a corresponding use of other features. Further, those skilled in the art will understand that variations can be made in the number and arrangement of components illustrated in the above figures.

The invention claimed is:

1. A method for parallel testing of a plurality of memory cells disposed in a plurality of memory arrays built using a semiconductor substrate, the method comprising:

creating a wafer containing the plurality of memory arrays, the wafer including at least one test memory array including a plurality of test memory cells, with each of the test memory cells having a word line and a bit line associated therewith, wherein the test memory array does not include a selector device associated therewith, and wherein the step of creating includes, after determining a selected plurality of test memory cells to test that is a subset of the plurality of test memory cells:

modifying a layout of connections within the test memory array between the selected plurality of test memory cells so that an unselected plurality of test memory cells is electrically disconnected from the selected plurality of test memory cells and the word lines and bit lines of the selected plurality of test memory cells are each connected to an associated test pad; and modifying conductor layer patterns disposed above and below the selected plurality of test memory cells to minimize resistances between the selected plurality of test memory cells;

connecting a multi-channel parallel parametric tester to a selected plurality of test pads associated with the selected plurality of test memory cells;

using the multi-channel parallel parametric tester, grounding word lines associated with memory cells that are not within the selected subset plurality of test memory cells to test;

using the multi-channel parallel parametric tester, applying a predetermined test signal to each of the word lines associated with the selected plurality of test memory cells; and using the multi-channel parallel parametric tester, measuring resistance values at each of the bit lines associated with the selected plurality of test memory cells.

2. The method according to claim 1, wherein the step of creating further includes the step of creating a short flow connection to the test memory array, such that a lesser number of metal layers exist than compared to a standard memory array created on the wafer.

3. The method according to claim 2, wherein the short flow connection includes only one metal layer on each of two opposite sides of the memory cell.

4. The method according to claim 2, wherein the short flow connection includes only two metal layers on one side of the memory cell and one metal layer on the opposite side of the memory cell.

5. The method of claim 1, further including the step of programming the subset plurality of memory cells to test using the multi-channel parallel parametric tester.

6. The method of claim 5, wherein the multi-channel parallel parametric tester is connected to the test memory array structure via a probe card, and further including the step of controlling or limiting current flow using the probe card.

7. The method of claim 6 wherein the probe card contains at least one of passive or active elements to control or limit the current flow.

8. The method of claim 1, wherein at least 128 memory cells are tested in parallel.

9. The method of claim 8, wherein the test signal is one of a voltage sweep and a voltage pulse.

10. The method of claim 9 wherein the test signal is a voltage pulse, and wherein the pulses are applied in a Program/Erase sequence to check functionality of the test memory cells, with Read conditions between each pulse to check the status of the test memory cells.

11. The method of claim 9 wherein the test signal is a voltage pulse, and wherein the pulses are applied in a Program/Erase sequence, in a repetitive manner, to test endurance and reliability of the test memory cells.

12. The method of claim 1 wherein routing of the connections within the test memory array is optimized to balance routing resistance taking into account the positioning of the plurality of test pads to achieve resistances of word line connections being substantially equal, as well as resistances of bit line connections being substantially equal.

13. The method according to claim 1 wherein the modifying conductor layer patterns disposed above and below the selected plurality of test memory cells to minimize resistances includes widening certain of the wires.

* * * * *